(12) United States Patent
Miyagoshi et al.

(10) Patent No.: US 11,167,541 B2
(45) Date of Patent: Nov. 9, 2021

(54) APPARATUS FOR MANUFACTURING ELEMENT ARRAY AND APPARATUS FOR REMOVING SPECIFIC ELEMENT

(71) Applicant: TDK CORPORATION, Tokyo (JP)

(72) Inventors: Toshinobu Miyagoshi, Tokyo (JP); Seijiro Sunaga, Tokyo (JP); Osamu Shindo, Tokyo (JP); Yasuo Kato, Tokyo (JP)

(73) Assignee: TDK CORPORATION, Tokyo (JP)

(*) Notice: Subject to any disclaimer, the term of this patent is extended or adjusted under 35 U.S.C. 154(b) by 0 days.

(21) Appl. No.: 16/713,763

(22) Filed: Dec. 13, 2019

(65) Prior Publication Data

US 2020/0215809 A1 Jul. 9, 2020

(30) Foreign Application Priority Data

Dec. 14, 2018 (JP) .............................. JP2018-234757

(51) Int. Cl.
*B32B 43/00* (2006.01)
*H01L 21/67* (2006.01)
(Continued)

(52) U.S. Cl.
CPC ...... *B32B 43/006* (2013.01); *H01L 21/67132* (2013.01); *B32B 38/10* (2013.01); *H01L 25/0753* (2013.01); *Y10S 156/924* (2013.01); *Y10S 156/93* (2013.01); *Y10S 156/931* (2013.01); *Y10S 156/937* (2013.01); *Y10S 156/941* (2013.01); *Y10S 156/942* (2013.01);
(Continued)

(58) Field of Classification Search
CPC . B32B 38/10; B32B 43/006; Y10T 156/1137; Y10T 156/1158; Y10T 156/1917; Y10T 156/1939; Y10S 156/924; Y10S 156/93; Y10S 156/931; Y10S 156/937; Y10S 156/941; Y10S 156/942
See application file for complete search history.

(56) References Cited

U.S. PATENT DOCUMENTS

| 7,473,321 | B2* | 1/2009 | Koga ................... B23K 26/147 118/326 |
| 8,366,874 | B2* | 2/2013 | Meloni ............. H05K 13/0486 156/708 |

(Continued)

FOREIGN PATENT DOCUMENTS

| JP | 2006-41500 A | 2/2006 |
| JP | 2011-159980 A | 8/2011 |

(Continued)

*Primary Examiner* — Philip C Tucker
*Assistant Examiner* — Nickolas R Harm
(74) *Attorney, Agent, or Firm* — Oliff PLC

(57) ABSTRACT

An apparatus for manufacturing an element array includes a substrate hold means, a laser radiation device, and a collection mechanism. The substrate hold means holds a substrate including an adhesive layer on which elements are attached in a predetermined array while a surface of the adhesive layer is inclined relative to a horizontal surface at a predetermined angle. The laser radiation device radiates a laser to a specific element among the elements attached on the adhesive layer. The collection mechanism is disposed below the substrate and configured to receive the specific element falling by the laser radiation.

18 Claims, 4 Drawing Sheets

(51) Int. Cl.
   *H01L 25/075* (2006.01)
   *B32B 38/10* (2006.01)
(52) U.S. Cl.
   CPC .... *Y10T 156/1137* (2015.01); *Y10T 156/1158* (2015.01); *Y10T 156/1917* (2015.01); *Y10T 156/1939* (2015.01)

(56) References Cited

U.S. PATENT DOCUMENTS

| | | | |
|---|---|---|---|
| 2005/0186709 A1* | 8/2005 | Okawa | C09J 7/245 438/113 |
| 2006/0007297 A1 | 1/2006 | Doi et al. | |
| 2008/0283198 A1* | 11/2008 | Papworth | H01L 21/67132 156/752 |
| 2009/0008032 A1* | 1/2009 | Wesseling | H01L 21/67132 156/712 |
| 2010/0041211 A1* | 2/2010 | Noda | H01L 21/6835 438/464 |
| 2010/0258543 A1* | 10/2010 | Mizuno | H01L 21/268 219/121.72 |
| 2011/0132549 A1* | 6/2011 | Sercel | B32B 38/10 156/712 |
| 2014/0238592 A1* | 8/2014 | Marinov | H01L 21/67132 156/272.8 |
| 2014/0305917 A1* | 10/2014 | Gadd | B23K 26/142 219/121.72 |
| 2015/0083343 A1* | 3/2015 | Fujii | B32B 43/006 156/712 |
| 2015/0221819 A1* | 8/2015 | Morikazu | B32B 38/10 156/247 |
| 2016/0133486 A1* | 5/2016 | Andry | B32B 43/006 428/40.4 |
| 2017/0358478 A1* | 12/2017 | Thothadri | H01L 21/6835 |
| 2018/0233394 A1* | 8/2018 | Burggraf | H01L 24/94 |
| 2018/0315657 A1* | 11/2018 | Ikeno | C30B 29/16 |

FOREIGN PATENT DOCUMENTS

| | | |
|---|---|---|
| JP | 2015-199094 A | 11/2015 |
| WO | 2008-143042 A1 | 11/2008 |

\* cited by examiner

APPARATUS FOR MANUFACTURING ELEMENT ARRAY AND APPARATUS FOR REMOVING SPECIFIC ELEMENT

BACKGROUND OF THE INVENTION

The present invention relates to an apparatus for manufacturing an element array formed by arraying display elements (e.g., LED elements) or so and to an apparatus for removing a specific element.

As display devices, proposed is a display device constituting a display element array formed by arraying multiple light emitting elements (LED elements). In conventional display devices using LED elements, LED elements that emit blue, green, or red light are formed on a semiconductor substrate and are thereafter arrayed in matrix on a display screen, and a driving wiring is formed thereon.

To array the elements formed on the semiconductor substrate at a predetermined position on the display device, a light-emitting diode element is transferred by a widely used method of arranging elements at a desired position using vacuum suction. The wiring is formed using a wire bonding technology or so.

The LED elements are manufactured using a semiconductor material whose raw material is expensive, such as gallium arsenide (GaAs) based material, gallium indium phosphorus (GaInP) based material, and gallium nitride (GaN) based material, and are thereby preferably small for reduction in manufacturing cost per element.

However, it is not easy to form a desired wiring by suctioning micro light emitting elements in a vacuum and arraying the elements at a position corresponding to a display screen, and it is also difficult to improve a position accuracy of the element array.

Then, proposed is a technique of selectively peeling micro light emitting diode elements formed in equal intervals on a substrate and transferring the elements onto another substrate (for example, see Patent Document 1).

In a conventional apparatus for transferring a display element as shown in Patent Document 1, however, an array of display elements formed on an element-formation substrate can, for example, be transferred onto a mounting substrate, but a no-good element may also be transferred. It is not easy to remove only a specific element after the element array is mounted on the mounting substrate.

In addition, the apparatus of Patent Document 1 employs a method of transferring elements by peeling them from a substrate with laser radiation from behind the substrate. Thus, if the elements are small, it is difficult to transfer only a specific element as its nearby elements are also transferred.

Patent Document 1: JP200641500 (A)

BRIEF SUMMARY OF INVENTION

The present invention has been achieved under such circumstances. It is an object of the invention to provide an apparatus for easily removing only a specific element even if elements arranged in a predetermined array are small and an apparatus for manufacturing an element array excluding a specific element.

To achieve the above object, an apparatus for manufacturing an element array according to the present invention includes:

a substrate hold means for holding a substrate including an adhesive layer on which elements are attached in a predetermined array while a surface of the adhesive layer is inclined relative to a horizontal surface at a predetermined angle;

a laser radiation device for radiating a laser to a specific element among the elements attached on the adhesive layer; and a collection mechanism disposed below the substrate and configured to receive the specific element falling by the laser radiation.

The present inventors have found that a specific element is easily removed while the predetermined array is maintained by arranging and attaching the elements in the predetermined array on the adhesive layer by, for example, a method of transferring a predetermined array of elements formed on an element-formation substrate onto the adhesive layer. That is, the present inventors have found that a direct laser radiation to only the specific element determined to be no-good removes the radiated element in a flip manner from the adhesive layer. At this time, the array of the good elements is maintained.

In the apparatus for manufacturing an element array according to the present invention, the substrate including the adhesive layer is held by the substrate hold means while the surface of the adhesive layer is inclined relative to the horizontal surface at the predetermined angle, and the specific element removed from the adhesive layer in a flip manner thereby falls toward the collection mechanism by gravity. Thus, the specific element removed from the adhesive layer in a flip manner does not fall on the other elements attached on the adhesive layer. As a result, the specific element is less likely to adversely affect the good elements by falling on them.

In the apparatus for manufacturing an element array according to the present invention, the adhesive layer is not very damaged at a position corresponding to the removed element, and a good element is easily disposed again at this position. Incidentally, for example, an element array is acceptable without disposing a good element.

In the apparatus for manufacturing an element array according to the present invention, the good elements attached in a predetermined array on the adhesive sheet are directly or indirectly transferred on a mounting substrate, and an element array can thereby be manufactured with the predetermined array being maintained without using a vacuum suction pickup device or so. Incidentally, the direct transfer means that the good elements are directly transferred from the adhesive layer onto the mounting substrate, and the indirect transfer means that the elements are transferred from the adhesive layer to another adhesive sheet for transfer or other members and are thereafter transferred on the mounting substrate. Incidentally, the element array can easily be transferred on the mounting substrate using the adhesive sheet.

In the apparatus for manufacturing an element array according to the present invention, even if the elements arranged in a predetermined array are small, only a no-good element is easily removed, and an element array without the no-good specific element can easily be manufactured.

An apparatus for removing a specific element according to the present invention includes:

a substrate hold means for holding a substrate including an adhesive layer on which elements are arranged in a predetermined array while a surface of the adhesive layer is inclined relative to a horizontal surface at a predetermined angle;

a laser radiation device for radiating a laser to a specific element among the elements attached on the adhesive layer; and a collection mechanism disposed below the substrate and configured to receive the specific element falling by the laser radiation.

In the apparatus for removing a specific element according to the present invention, even if the elements arranged in a predetermined array are small, only a specific element (e.g., no-good element) is easily removed. In the apparatus for removing a specific element according to the present invention, the substrate including the adhesive layer is held by the substrate hold means while the surface of the adhesive layer is inclined relative to the horizontal surface at the predetermined angle, and the specific element removed from the adhesive layer in a flip manner thereby falls toward the collection mechanism by gravity. Thus, the specific element removed from the adhesive layer in a flip manner does not fall on the other elements attached on the adhesive layer. As a result, the specific element is less likely to adversely affect the good elements by falling on them.

The collection mechanism may include a suction mechanism. When the collection mechanism includes a suction mechanism, the specific element separated from the adhesive layer can securely be pulled into the collection mechanism.

The apparatuses according to the present invention may further include a gas blow mechanism for forming a gas flow going from a surface of the specific element toward the collection mechanism. Since the gas blown from the gas blow mechanism passes over the specific element and forms a gas flow toward the collection mechanism, the specific element separated from the adhesive layer can securely be sent into the collection mechanism.

The apparatuses according to the present invention may further include a movement mechanism for relatively moving the substrate in a two-dimensional direction along a perpendicular surface to a radiation direction of the laser emitted from the laser radiation device. In this structure, the laser is easily radiated to only the specific element. Moreover, this structure allows the apparatuses according to the present invention to have a simple configuration and contributes to cost reduction, compared to a mechanism where the laser radiation direction is optically changed.

Preferably, the laser radiation device radiates the laser to the specific element in a radiation area having a rectangular spot shape fitted to a plane shape of the specific element. The radiation of the laser light in such a manner easily removes only the specific element from the adhesive layer without affecting other nearby elements.

Preferably, the laser radiation device radiates the laser in an area including an entire plane shape of the specific element. The radiation of the laser light in such a manner easily removes the specific element from the adhesive layer.

Preferably, the laser has an output power and a wavelength determined so that the specific element is flipped away from the adhesive sheet by the laser radiation of the laser radiation device to the specific element with three or less shots (more preferably two shots or less, still more preferably one shot). The smaller the number of shots is, the less the adhesive layer is damaged, and the less the good elements near the element to be removed are likely to be damaged.

Preferably, the laser radiated by the laser radiation device has a wavelength of 532 nm or less (more preferably, 266 nm or less). The radiation of the laser light in such a manner easily removes only the specific element from the adhesive layer without affecting other nearby elements.

DETAILED DESCRIPTION OF INVENTION

Hereinafter, the present invention is explained based on an embodiment shown in the figures.

Figure 1:
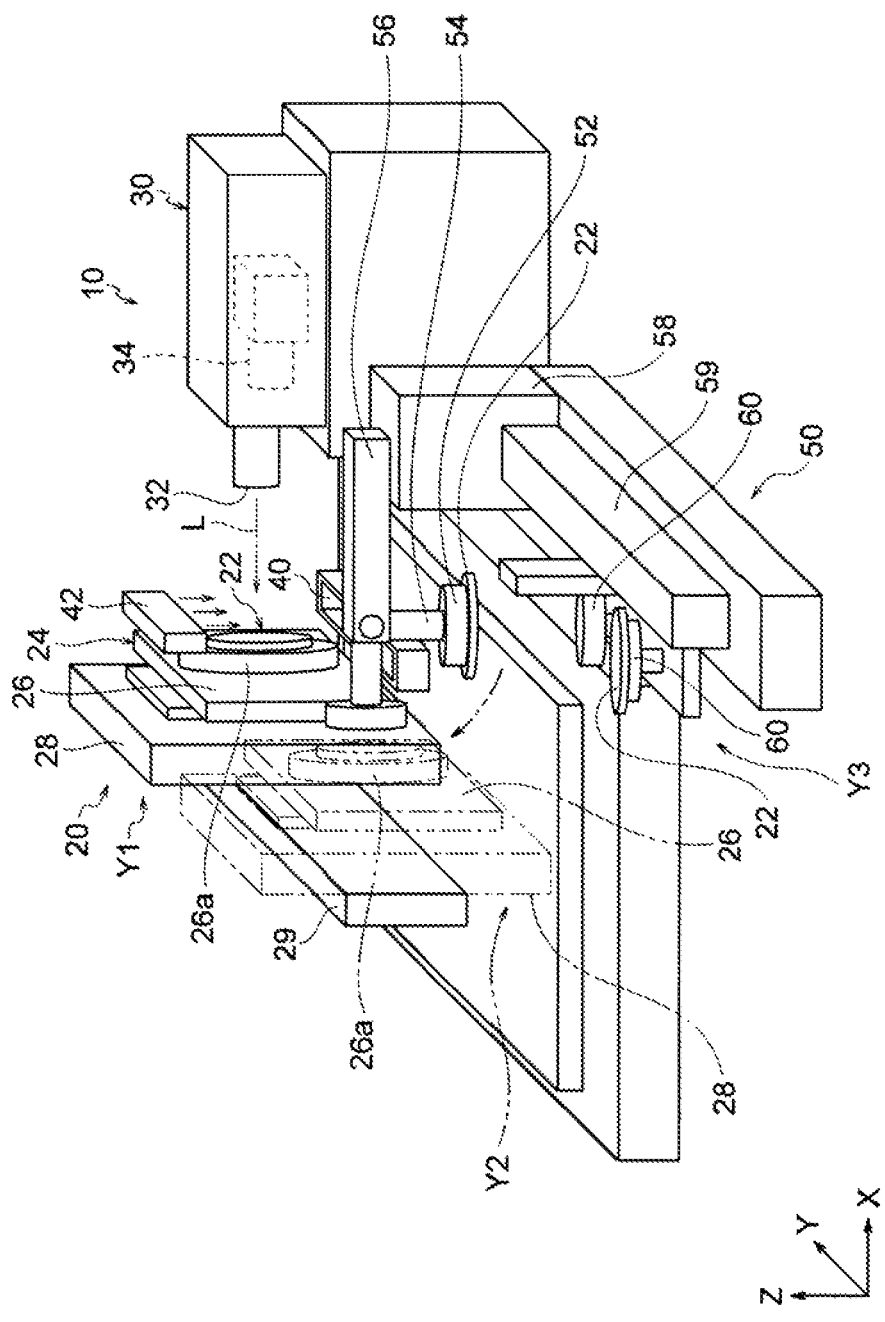
FIG. 1 is a schematic perspective view illustrating a main part of an apparatus used for a method of manufacturing an element array according to an embodiment of the present invention.

As shown in FIG. 1, an apparatus 10 for manufacturing an element array according to an embodiment of the present invention includes an apparatus 20 for removing a specific element and a substrate attachment apparatus 50. The removal apparatus 20 can remove a no-good specific element. The substrate attachment apparatus 50 attaches a substrate onto a substrate stage 24 of the removal apparatus 20.

The apparatus 20 for removing a specific element includes the substrate stage 24 and a laser radiation device 30. The substrate stage 24 is a substrate hold means for holding a substrate 22. The laser radiation device 30 emits a laser light L to the surface of the substrate 22.

The substrate stage 24 includes a Z-axis movable table 26, a Y-axis movable base 28, and a rail 29. The Z-axis movable table 26 includes an installation stand 26a for detachably holding the substrate 22 and is attached movably in the Z-axis direction onto the Y-axis movable base 28. The installation stand 26a may be provided with a suction mechanism for detachably holding the substrate.

The Y-axis movable base 28 is movable between a processing position Y1 and an attachment position Y2 along the rail 29 in the Y-axis direction. The substrate stage 24 has a movement mechanism in which the substrate 22 is moved along a plane substantially perpendicular to the laser light L emitted from an emitting part 32 of the laser radiation device 30 in the X-axis direction by the movement of the Z-axis movable table 26 in the Z-axis direction and the movement of the Y-axis movable base 28 in the Y-axis direction. In the present embodiment, the X-axis and the Y-axis are parallel to the horizontal plane, the Z-axis is parallel to the vertical line, and the X-axis, the Y-axis, and the Z-axis are perpendicular to each other.

Figure 3:
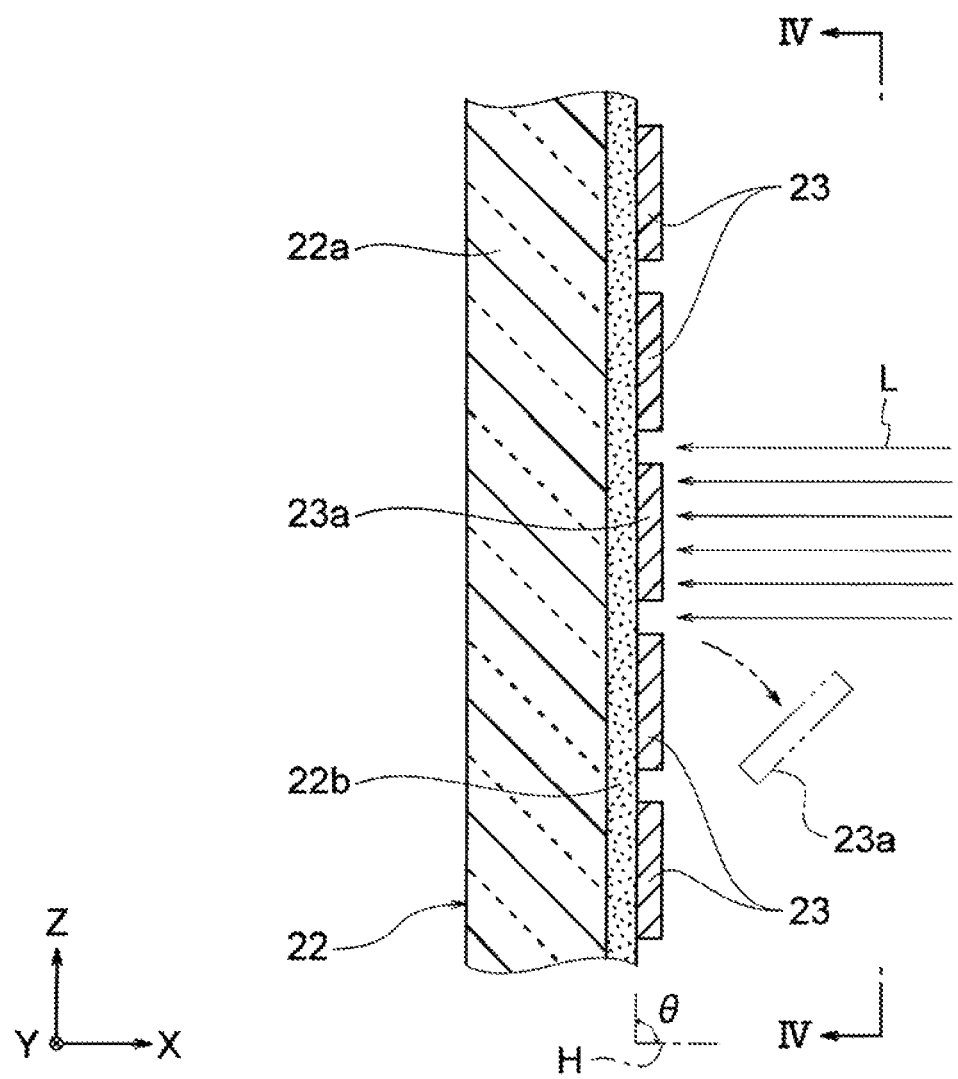
FIG. 3 is a cross-sectional view of a main part illustrating the next step of FIG. 2.

As shown in FIG. 3, the substrate 22 is formed from a substrate body 22a and an adhesive layer 22b formed on the substrate body 22a. The substrate body 22a may be a flexible adhesive sheet by itself or may be a rigid substrate on which an adhesive sheet (an adhesive layer is formed) is adhered. The adhesive layer 22b is made of an adhesive resin (e.g., natural rubber, synthetic rubber, acrylic based resin, silicone rubber) and preferably has a thickness of 1.0-10.0 μm.

Figure 4:
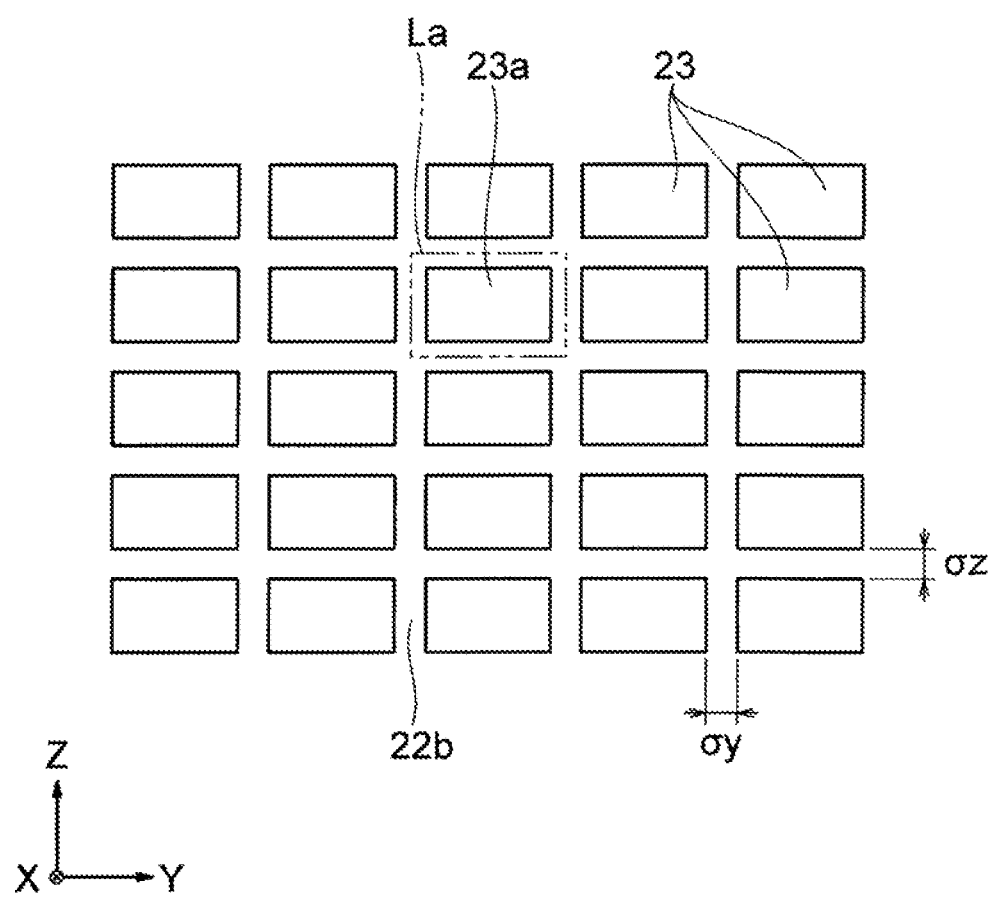
FIG. 4 is a plane view of an element array along the IV-IV line shown in FIG. 3.

In the present embodiment, as shown in FIG. 4, elements 23 are detachably attached in matrix onto the surface of the adhesive layer 22b formed on the substrate body 22a with a predetermined interval δy in the Y-axis direction and a predetermined interval δz in the Z-axis direction. The elements 23 are not limited and are, for example, a display element. Incidentally, the display element is not limited to an element for displaying screen and may be an element for illumination (e.g., light emitting element (LED element), fluorescent element). The elements 23 are not limited to a display element and may be an electronic device (e.g., ceramic capacitors, chip inductors) or a semiconductor element.

In the present embodiment, for example, the elements 23 are a micro light emitting element (micro LED element) having a plane size of, for example, 5 μm×5 μm to 200 μm×300 μm. The predetermined interval δy and the predetermined interval δz may be the same as or different from each other and are, for example, 5-100 μm.

In the present embodiment, as shown in FIG. 3, the substrate 22 is attached onto the substrate stage 24 shown in FIG. 1 so that the surface of the adhesive layer 22b is inclined relative to a horizontal surface H at a predetermined angle θ. In the present embodiment, the horizontal surface H is parallel to the X-axis and the Y-axis and perpendicular to the Z-axis (vertical line). The predetermined angle θ is 90 degrees, but may be an angle other than 90 degrees, such as 15 degrees to 120 degrees (preferably 30 degrees to 110 degrees, more preferably 45 degrees to 100 degrees, still more preferably 60 degrees to 90 degrees).

The laser light L emitted from the emitting part 32 of the laser radiation device 30 shown in FIG. 1 is substantially perpendicularly radiated to the adhesive layer 22b shown in FIG. 3 and is radiated to only a specific element 23a of the elements 23 arranged in a predetermined array as shown in FIG. 4. Thus, the laser radiation device 30 shown in FIG. 1 may have a radiation mask for directly radiating the laser light L to only the specific element 23a in a radiation area La having a rectangular spot shape fitted to a plane shape of the specific element 23a or in an area including an entire plane shape of the specific element 23a shown in FIG. 4.

The laser radiation device 30 shown in FIG. 1 may contain an image sensor 34. The image sensor 34 may be disposed separately from the laser radiation device 30 and can take an image of an array of the elements 23 shown in FIG. 4. The image sensor 34 may take an image of the elements 23 shown in FIG. 4 for visual inspection of each of the elements 23. The movement of the substrate stage 24 shown in FIG. 1 may be controlled so that the laser light L is radiated to only the specific element 23a determined to be no-good in the visual inspection. For example, the substrate 22 is moved in the plane direction (in the Z-axis or the Y-axis) by controlling the movement of the substrate stage 24 shown in FIG. 1 so that the laser light L is radiated to only the specific element 23a.

As shown in FIG. 1, a collection mechanism 40 is disposed below the substrate 22 in the Z-axis direction attached on the installation stand 26a at the processing position Y1. As mentioned below, the collection mechanism 40 has an upper opening for receiving the specific element 23a shown in FIG. 3 falling from the substrate 22. The upper opening has a width in the Y-axis direction that is larger than an outer diameter of the substrate 22 and has a width in the X-axis direction that is larger than a thickness of the substrate 22. The upper opening is large enough to receive the specific element 23a shown in FIG. 3 falling from any position on the surface of the substrate 22.

The collection mechanism 40 may contain a suction mechanism for suctioning ambient gas. A gas blow mechanism 42 is disposed above the substrate 22 attached on the installation stand 26a and is disposed over the collection mechanism 40 in the Z-axis direction. The gas blow mechanism 42 blows a gas (e.g., air, inert gas), and this blown gas flows downward in the Z-axis into the upper opening of the collection mechanism 40 shown in FIG. 1 via the surface of the specific element 23a attached on the substrate 22 shown in FIG. 3.

The substrate attachment apparatus 50 shown in FIG. 1 is disposed at the attachment position Y2 located next to the removal apparatus 20 in the Y-axis direction located at the processing position Y1 and includes a substrate suction instrument 52. The substrate suction instrument 52 is an instrument for transporting the substrate 22 moved on a temporary stand with the state of FIG. 3 through the step of FIG. 2 onto the installation stand 26a moved at the attachment position Y2.

The substrate suction instrument 52 is fixed at a tip of a rotation rod 54 and is installed rotatably at a tip of a support rod 56. The support rod 56 is fixed to the upper end of the Y-axis movable block 58 and is reciprocable between the attachment position Y2 and a delivery position Y3 in the Y-axis direction. Incidentally, the rotation rod 54 may be extendible for allowing the substrate suction instrument 52 to move in the Z-axis direction, or the substrate attachment apparatus 50 may partially or wholly be movable in the Z-axis direction. The support rod 56 may be movable in the X-axis direction.

Next, explained is a method of manufacturing an element array according to an embodiment of the present invention, particularly a method of manufacturing a light emitting element (LED element) array.

Figure 2:
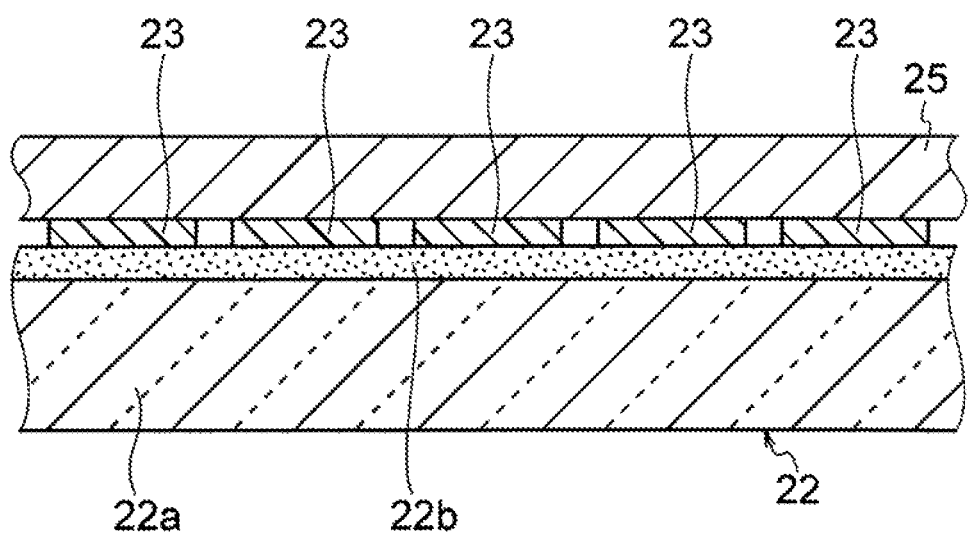
FIG. 2 is a cross-sectional view of a main part illustrating a step of a method of manufacturing an element array according to an embodiment of the present invention.

First of all, an element array where the elements 23 (e.g., LED elements) are arranged in matrix is formed on the element-formation substrate 25 shown in FIG. 2. The substrate 25 used for manufacturing the element array differs depending upon, for example, kind of the elements 23 (e.g., blue light emitting elements, red light emitting elements, green light emitting elements), but is a sapphire substrate, a glass substrate, a GaAs substrate, a SiC substrate, or the like.

After the array of the elements 23 is formed on the substrate 25, as shown in FIG. 2, the substrate 25 with the elements 23 is pushed against the adhesive layer 22b formed on the substrate 22, and only the array of the elements 23 is peeled from the substrate 25 and transferred on the adhesive layer 22b by laser lift method or so. Incidentally, the array of the elements 23 is transferred not only by laser lift method, but may be transferred using difference in adhesive strength, heat peeling, or the like.

The substrate 22 on which the array of the elements 23 is transferred is transported on a temporary installation stand 60 disposed at the delivery position Y3 shown in FIG. 1. The substrate 22 transported on the temporary installation stand 60 is attached by the substrate attachment apparatus 50 onto the installation stand 26a of the table 26 moved at the attachment position Y2. The substrate 22 attached at the attachment position Y2 is moved to the processing position Y1.

At the processing position Y1, each of the elements 23 arranged in array as shown in FIG. 4 is subjected to a visual inspection using, for example, the image sensor 34 so as to find a no-good (unnecessary) specific element 23a. Incidentally, the inspection may be carried out before the substrate 22 is placed at the processing position Y1.

Next, as shown in FIG. 3 and FIG. 4, the movement of the substrate stage 24 shown in FIG. 1 is controlled so that laser light L from the laser radiation device 30 is radiated to only the specific element 23a in the radiation area La. At this time, the movement of the substrate stage 24 may be controlled while the position of the specific element 23a is being detected using the image sensor 34.

Next, the laser light L from the laser radiation device 30 is radiated to only the specific element 23a in the radiation area La having a rectangular spot shape fitted to a plane shape of the specific element 23a. The radiation of the laser light L in such a manner easily removes only the specific element 23a from the adhesive layer 22b without affecting other nearby elements 23.

The laser light L is radiated to the specific element 23a in an area where the entire plane shape of the specific element 23a is contained. The radiation of the laser light L in such a manner easily removes the specific element 23a from the adhesive layer 22b.

The laser light L has an output power and a wavelength determined so that the specific element 23a is flipped away from the adhesive layer 22b by the radiation of the laser light L from the laser radiation device 30 with preferably three shots or less, more preferably two shots or less, still more preferably one shot. The smaller the number of shots is, the less the adhesive layer 22b is damaged, and the less the good elements 23 near the element 23a to be removed are likely to be damaged.

Preferably, the laser light L has a wavelength of 532 nm or less (more preferably, 266 nm or less). The radiation of such a laser light L easily removes only the specific element 23a from the adhesive layer 22b without affecting other nearby elements 23. Specifically, the laser radiation device 30 shown in FIG. 1 is a YAG laser, a carbon dioxide laser, an excimer laser, a UV laser, or the like. In view of laser wavelength and energy for removal, the laser radiation device 30 shown in FIG. 1 is preferably a YAG laser.

In the apparatus 10 for manufacturing an element array of the present embodiment, as mentioned above, the elements 23 are arranged and adhered in a predetermined array onto the adhesive layer 22b by a method (e.g., a method of transferring the elements 23 formed in a predetermined array on the element-formation substrate 25 shown in FIG. 2 onto the adhesive layer 22b of the substrate 22), and the specific element 23a determined to be no-good is thereby easily removed while the predetermined array is maintained. That is, the direct radiation of the laser light L to only the specific element 23a as shown in FIG. 3 removes the radiated element 23a in a flip manner from the adhesive layer 22b. At this time, the array of the good elements 23 is maintained.

Incidentally, the reason why the radiated element 23a is removed in a flip manner from the adhesive layer 22b is that the energy applied to the element 23a by laser radiation reaches the interface between the element 23a and the adhesive layer 22b and peels the adhesion between the adhesive layer 22b and the element 23a as a physical stress, or that the energy applied to the element 23a by laser radiation functions as an external force directly acting on the element, which peels the element 23a.

The adhesive layer 22b is not very damaged at a position corresponding to the removed element 23a, and the good element 23 can be disposed again at this position by a normal method (e.g., transfer method, suction transportation method, stamp method).

Incidentally, for example, a display device (including an illumination device) having an element array may be acceptable without disposing the good element 23 again at a position where the specific element 23a is removed. For example, when the elements 23 have a small size, there may be no problem with a display device (including an illumination device) having an element array as a whole even if a specific one element 23a among two or more arrayed elements 23 is missing.

In the apparatus 10 according to the present embodiment, the good elements 23 attached in a predetermined array on the substrate 22 are directly or indirectly transferred on a mounting substrate (not illustrated), and an element array (e.g., micro LED element array) can thereby be manufactured with the predetermined array being maintained without using a vacuum suction pickup device or so. Incidentally, the direct transfer means that the substrate 22 is used as it is, and the indirect transfer means that the elements 23 are transferred from the substrate 22 to another adhesive sheet for transfer or other members and are thereafter transferred on the mounting substrate.

In the apparatus 10 according to the present embodiment, even if the elements 23 arranged in a predetermined array are as small as 5 μm×5 μm or less, only the specific element 23a is easily removed, and an element array from which the no-good element 23a is removed can easily be manufactured.

In the apparatus 10 according to the present embodiment, the substrate 22 including the adhesive layer 22b is held by the substrate stage 24 while the surface of the adhesive layer 22b shown in FIG. 3 is inclined relative to the horizontal surface H at the predetermined angle θ, and the specific element 23a removed from the adhesive layer 22b in a flip manner thereby falls toward the collection mechanism 40 by gravity. Thus, the specific element 23a removed from the adhesive layer 22b in a flip manner does not fall on the other elements 23 attached on the adhesive layer 22b. As a result, the specific element 23a is less likely to adversely affect the good elements 23 by falling on them.

In the present embodiment, the collection mechanism 40 has a suction mechanism. Since the collection mechanism 40 has a suction mechanism, the specific element 23a separated from the adhesive layer 22b can securely be pulled into the collection mechanism 40.

Moreover, the apparatus 20 of the present embodiment includes the gas blow mechanism 42 for forming a gas flow going from the surface of the specific element 23a toward the collection mechanism 40. Since the gas blown from the gas blow mechanism 42 passes over the specific element 23a and forms a gas flow toward the collection mechanism 40, the specific element 23a separated from the adhesive layer 22b can securely be sent into the collection mechanism 40.

Incidentally, the present invention is not limited to the above-mentioned embodiment and may variously be changed within the scope of the present invention.

The elements 23 may be inspected by a device other than the image sensor 34. After the elements 23 are formed on the substrate 25 shown in FIG. 2, each of the elements 23 may be inspected visually by an image sensor (not illustrated) so as to determine the no-good element 23, and this array position may be memorized. After that, at the processing position Y1 shown in FIG. 1, the laser light L from the laser radiation device 30 may be radiated to only the specific element 23a at the memorized array position so as to remove only the specific element 23a. Incidentally, the inspection of each of the elements 23 is not only a visual inspection, but an electric inspection or so.

In the above-mentioned embodiment, the movement of the substrate stage 24 shown in FIG. 1 is controlled so that the laser light L is radiated to only the specific element 23a, but the radiation direction of the laser light L may be controlled so that the laser light L is radiated to only the specific element 23a using, for example, galvanometer mirror and Fθ lens. The mechanism with galvanometer mirror and Fθ lens may be similar to the mechanism with laser scanning, but controlling the movement of the substrate stage 24 can further simplify an apparatus configuration as a whole and contributes to cost reduction.

DESCRIPTION OF THE REFERENCE NUMERICAL

10 . . . apparatus for manufacturing element array
20 . . . apparatus for removing specific element
22 . . . substrate (adhesive sheet)
22a . . . substrate body
22b . . . adhesive layer
23 . . . element
23a . . . specific element
24 . . . substrate stage (substrate hold means)
25 . . . element-formation substrate
26 . . . Z-axis movable table
26a . . . installation stand
28 . . . Y-axis movable base
29 . . . rail
30 . . . laser radiation device
32 . . . laser emitting part
34 . . . image sensor
40 . . . collection mechanism
42 . . . gas blow mechanism
50 . . . substrate attachment apparatus
52 . . . substrate suction instrument
54 . . . rotation rod
56 . . . support rod
58 . . . Y-axis movable block
59 . . . rail
60 . . . temporary installation stand
L . . . laser light
La . . . radiation area
Y1 . . . processing position
Y2 . . . attachment position
Y3 . . . delivery position

What is claimed is:

1. An apparatus for manufacturing an element array comprising:
    a substrate hold means for holding a substrate including an adhesive layer on which elements are attached in a predetermined array while a surface of the adhesive layer is inclined relative to a horizontal surface at a predetermined angle;
    a laser radiation device for radiating a laser to a specific element among the elements attached on the adhesive layer to remove the specific element from the adhesive layer;
    a collection mechanism disposed below the substrate and configured to receive the specific element removed from the adhesive layer by the laser radiation device; and
    a movement mechanism for moving the substrate in a two-dimensional direction along a surface substantially perpendicular to a radiation direction of the laser emitted from the laser radiation device.

2. The apparatus according to claim 1, wherein the collection mechanism includes a suction mechanism.

3. The apparatus according to claim 1, further comprising a gas blow mechanism for forming a gas flow going from a surface of the specific element toward the collection mechanism.

4. The apparatus according to claim 1, wherein the laser radiation device radiates the laser to the specific element in a radiation area having a rectangular spot shape fitted to a plane shape of the specific element.

5. The apparatus according to claim 1, wherein the laser radiation device radiates the laser in an area including an entire plane shape of the specific element.

6. The apparatus according to claim 1, wherein the laser has an output power and a wavelength determined so that the specific element is flipped away from the adhesive layer by three or less shots of the laser radiation from the laser radiation device to the specific element.

7. The method according to claim 1, wherein the laser radiated by the laser radiation device has a wavelength of 532 nm or less.

8. An apparatus for removing a specific element comprising:
    a substrate hold means for holding a substrate including an adhesive layer on which elements are arranged in a predetermined array while a surface of the adhesive layer is inclined relative to a horizontal surface at a predetermined angle;
    a laser radiation device for radiating a laser to a specific element among the elements attached on the adhesive layer to remove the specific element from the adhesive layer;
    a collection mechanism disposed below the substrate and configured to receive the specific element removed from the adhesive layer by the laser radiation device; and
    a movement mechanism for moving the substrate in two-dimensional direction along a surface substantially perpendicular to a radiation direction of the laser emitted from the laser radiation device.

9. The apparatus according to claim 8, wherein the collection mechanism includes a suction mechanism.

10. The apparatus according to claim 8, further comprising a gas blow mechanism for forming a gas flow going from a surface of the specific element toward the collection mechanism.

11. The apparatus according to claim 8, wherein the laser radiation device radiates the laser to the specific element in a radiation area having a rectangular spot shape fitted to a plane shape of the specific element.

12. The apparatus according to claim 8, wherein the laser radiation device radiates the laser in an area including an entire plane shape of the specific element.

13. The apparatus according to claim 8, wherein the laser has an output power and a wavelength determined so that the specific element is flipped away from the adhesive layer by three or less shots of the laser radiation from the laser radiation device to the specific element.

14. The method according to claim 8, wherein the laser radiated by the laser radiation device has a wavelength of 532 nm or less.

15. An apparatus for manufacturing an element array comprising:
    a substrate hold portion including an installation stand configured to detachably hold a substrate including an adhesive layer on which elements are attached in a predetermined array while a surface of the adhesive layer is inclined relative to a horizontal surface at a predetermined angle;
    a laser radiation device configured to radiate a laser to a specific element among the elements attached on the adhesive layer to remove the specific element from the adhesive layer;

a collection mechanism disposed below the substrate and including an opening for receiving the specific element removed from the adhesive layer by the laser radiation; and a movement portion having a mechanism that is configured to move the substrate relatively in a two-dimensional direction along a surface substantially perpendicular to a radiation direction of the laser emitted from the laser radiation device.

16. The apparatus according to claim 15, further comprising a gas blow mechanism that is configured to blow a predetermined gas to form a gas flow going from a surface of the specific element toward the collection mechanism.

17. An apparatus for removing a specific element comprising:

a substrate hold portion including an installation stand configured to detachably hold a substrate including an adhesive layer on which elements are arranged in a predetermined array while a surface of the adhesive layer is inclined relative to a horizontal surface at a predetermined angle;

a laser radiation device configured to radiate a laser to a specific element among the elements attached on the adhesive layer to remove the specific element from the adhesive layer;

a collection mechanism disposed below the substrate and including an opening for receiving the specific element removed from the adhesive layer by the laser radiation; and a movement portion having a mechanism that is configured to move the substrate relatively in a two-dimensional direction along a surface substantially perpendicular to a radiation direction of the laser emitted from the laser radiation device.

18. The apparatus according to claim 17, further comprising a gas blow mechanism that is configured to blow a predetermined gas to form a gas flow going from a surface of the specific element toward the collection mechanism.

* * * * *